United States Patent [19]

Chan

[11] Patent Number: 4,845,390

[45] Date of Patent: * Jul. 4, 1989

[54] DELAY CONTROL CIRCUIT

[75] Inventor: Steven S. Chan, Fremont, Calif.

[73] Assignee: LSI Logic Corporation, Milpitas, Calif.

[*] Notice: The portion of the term of this patent subsequent to Apr. 12, 2005 has been disclaimed.

[21] Appl. No.: 141,862

[22] Filed: Jan. 11, 1988

Related U.S. Application Data

[63] Continuation-in-part of Ser. No. 670,454, Nov. 9, 1984, Pat. No. 4,737,670.

[51] Int. Cl.[4] .................... H03K 5/13; H03K 5/159
[52] U.S. Cl. .................................. 307/602; 307/603; 307/605; 307/606; 307/590; 307/591; 307/595; 328/55; 328/56
[58] Field of Search ............. 307/603, 605, 606, 590, 307/591, 595, 602, 296.1; 328/55, 56

[56] References Cited

U.S. PATENT DOCUMENTS

| | | | |
|---|---|---|---|
| 3,622,809 | 11/1971 | Williams | 307/606 |
| 3,735,270 | 5/1973 | Holub | 328/55 |
| 4,330,750 | 5/1982 | Mayor | 328/55 |
| 4,494,021 | 1/1985 | Bell et al. | 307/606 |
| 4,504,749 | 3/1985 | Yoshida | 307/602 |
| 4,539,490 | 9/1985 | Ariizumi et al. | 307/296.1 |
| 4,623,805 | 11/1986 | Flora et al. | 307/606 |
| 4,737,670 | 4/1988 | Chan | 307/602 |

Primary Examiner—Stanley D. Miller
Assistant Examiner—Trong Quang Phan
Attorney, Agent, or Firm—Skjerven, Morrill, MacPherson, Franklin & Friel

[57] ABSTRACT

A circuit (40) constructed in accordance with this invention includes a ring oscillator (25) to provide a signal which is dependent on the propagation delays of the inverters (33, 34, 35) comprising the ring oscillator, therefore the frequency of the ring oscillator is inversely dependent upon the propagation delays of the inverter comprising the ring oscillator. Means (37) are provided to determine the propagation delay introduced by the components in the ring oscillator by measuring the frequency of the output signal produced by the ring oscillator which provides a signal to a multiplexer (36) which selects among a number of preset delay components (26) those components which are necessary to ensure that the propagation delay caused by the circuitry (not shown) connected to the input lead (21) of the circuit constructed in accordance with this invention plus the propagation delay introduced by the selectable delay elements is nearly a constant propagation delay.

2 Claims, 3 Drawing Sheets

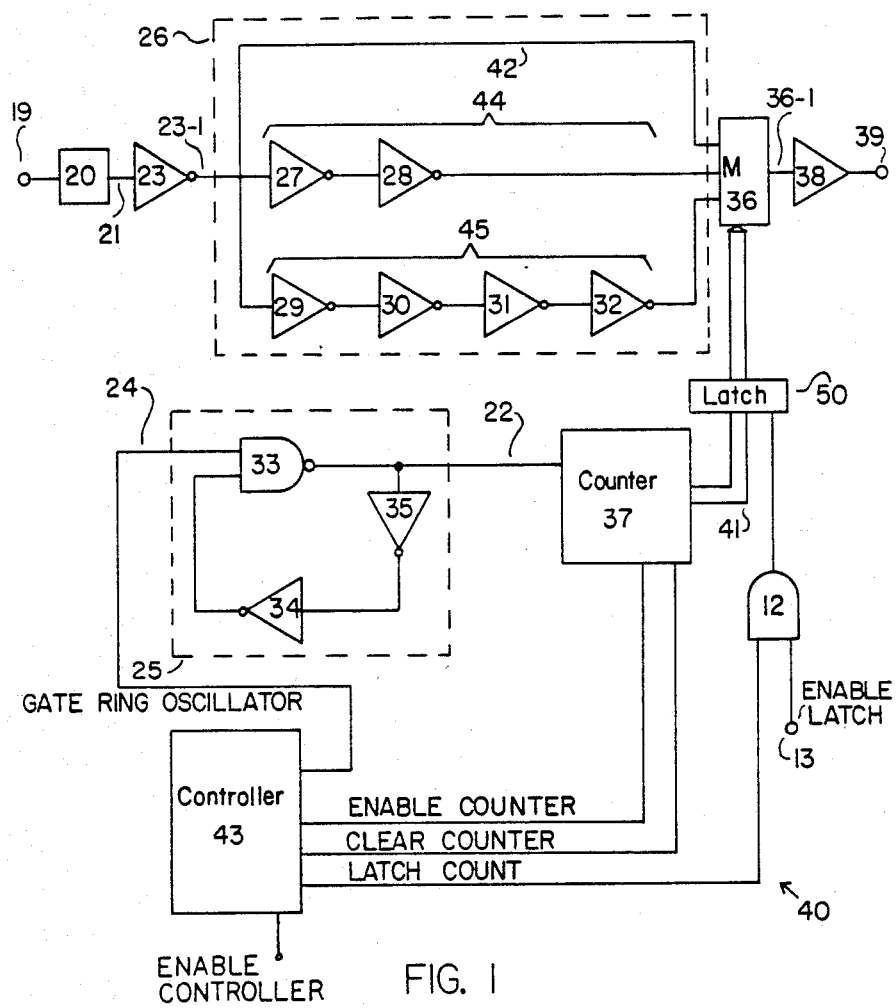
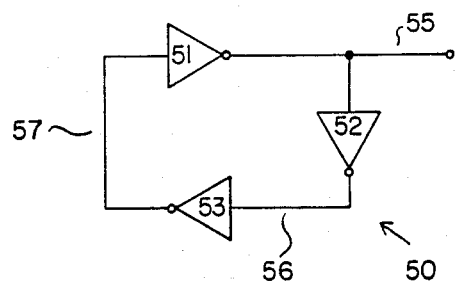
FIG. 1
FIG. 2

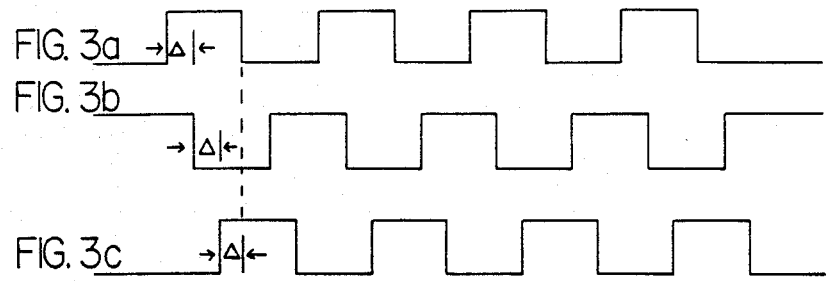
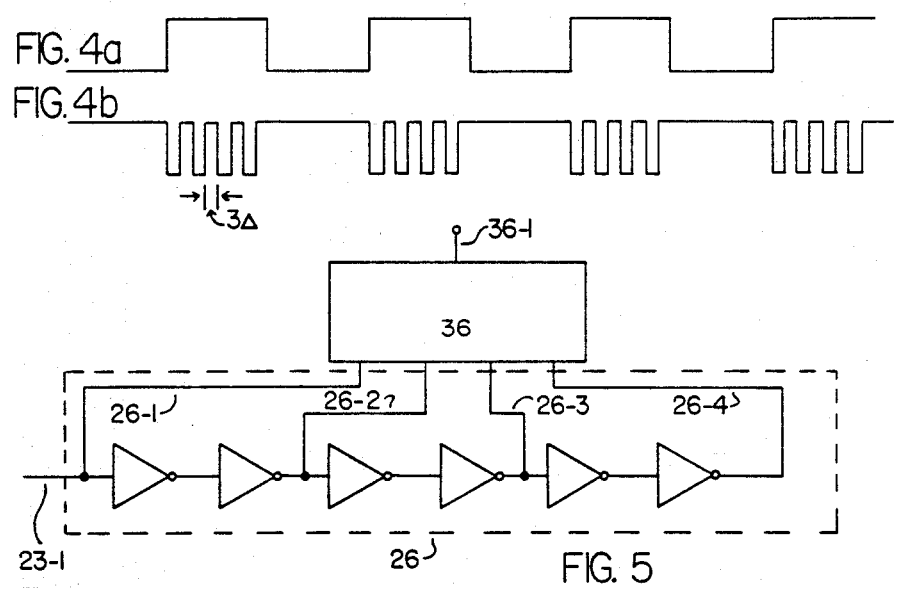
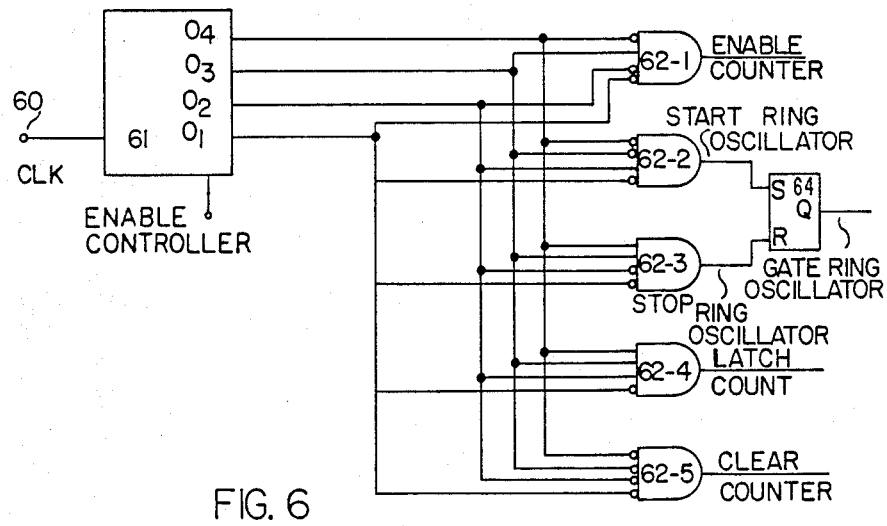

DELAY CONTROL CIRCUIT

REFERENCE TO RELATED CASE

This is a continuation-in-part of U.S. patent application Ser. No. 06/670,454, filed Nov. 9, 1984 now U.S. Pat. No. 4,737,670 issued Apr. 12, 1988.

BACKGROUND OF THE INVENTION

1. Field of the Invention

This invention relates to propagation delay control devices in logic circuitry and more specifically to methods and structures for maintaining constant time delays in semiconductor structure irrespective of processing factors and external environmental conditions such as temperature and power supply voltage.

2. Description of the Prior Art

Generally, it is expected that a given digital signal will appear at a given location within a circuit during a particular period of time. For example, when reading a memory device such as a ROM, it is expected that data information will be provided on the data output leads within a given period of time after the receipt of appropriate addressing and enabling signals. In other words, after the receipt of the desired address to be read, and a chip enable or output enable signal, the data signals are expected to appear not sooner than T1 seconds thereafter, and not later than T2 seconds thereafter. The reason for this is that the circuitry which is to receive the data information is constructed in a manner which requires the data information to be provided during this time period. If this data information is provided before time T1, previous data may be lost. If the data is not provided during the period between time T1 and time T2, the data will not be received. If the data is continued to be provided after time T2, additional data, such as is provided by another memory device or other circuitry may be lost.

In a similar manner, binary signals from any one of a number of circuits must appear at a selected node during a given period of time. Due to the variations in propagation delays caused by a number of factors, such as specific processing parameters, power supply voltage levels, ambient temperatures of the device, and the like, it is often times difficult or impossible to ensure that data is provided during the appropriate window of time. In many silicon semiconductor devices, the propagation delay of a gate can vary significantly depending on process variations, temperatures, and the like.

U.S. Pat. No. 4,494,021 to Bell, et al., discloses circuitry for providing the control of propagation delays. Such circuitry is capable of achieving relatively fine tuning in adjusting the frequency of a voltage to substantially equal that of a reference frequency. This is achieved through a comparison of the VCO 18 frequency with the reference frequency $R_f$ to produce a control voltage $V_c$ via phase comparator 22, for adjusting the frequency of VCO 18 to equal that of reference frequency $R_f$. Thus, it is a difference or relative signal produced by Bell et al. which controls the Bell et al. delay means.

While such a system may be effective for the use intended, it is complex and expensive, and is not, in fact, appropriate in those situations where a relatively gross or large adjustment is necessary.

SUMMARY

A circuit constructed in accordance with this invention includes an input terminal for receiving a digital input signal and an output terminal for providing an output signal a predefined time after receipt of the input signal. A circuit constructed in accordance with this invention includes a ring oscillator to provide a signal whose actual frequency of oscillation is inversely dependent on the propagation delays of the gates forming the ring oscillator and thus indicative of the propagation delays of the remainder of the circuit. The actual frequency of the oscillator is measured, the means for this measurement producing an output signal. Means are provided to determine the propagation delay introduced by the components in the ring oscillator which provides the output signal to a multiplexer which chooses a selected one of a plurality of delay lines, each providing a predefined propagation delay. The selected delay line provides a propagation delay which, when added to the propagation delay of digital circuitry connected to the input terminal, provides a constant propagation delay of the digital circuitry and the circuit constructed in accordance with this invention. Thus by selecting a delay time having a delay in inverse relationship to the delay of the additional circuitry, a relatively constant total propagation delay is provided regardless of the variations in propagation delay of the digital circuitry, for example due to variations in operating temperature or power supply voltage levels or process.

BRIEF DESCRIPTION OF THE DRAWINGS

FIG. 1 is a schematic diagram of one embodiment of the present invention;

FIG. 2 is a schematic diagram of a ring oscillator;

FIGS. 3a through 3c are voltage versus time waveforms provided by the ring oscillator of FIG. 2;

FIGS. 4a and 4b are voltage versus time waveforms of two of the signals provided in circuit 25 of FIG. 1;

FIG. 5 is a schematic diagram of an alternative embodiment of delay block 26 of FIG. 1;

FIG. 6 is a schematic diagram of one embodiment of controller 43 of FIG. 1; and

DETAILED DESCRIPTION

Figure 7:
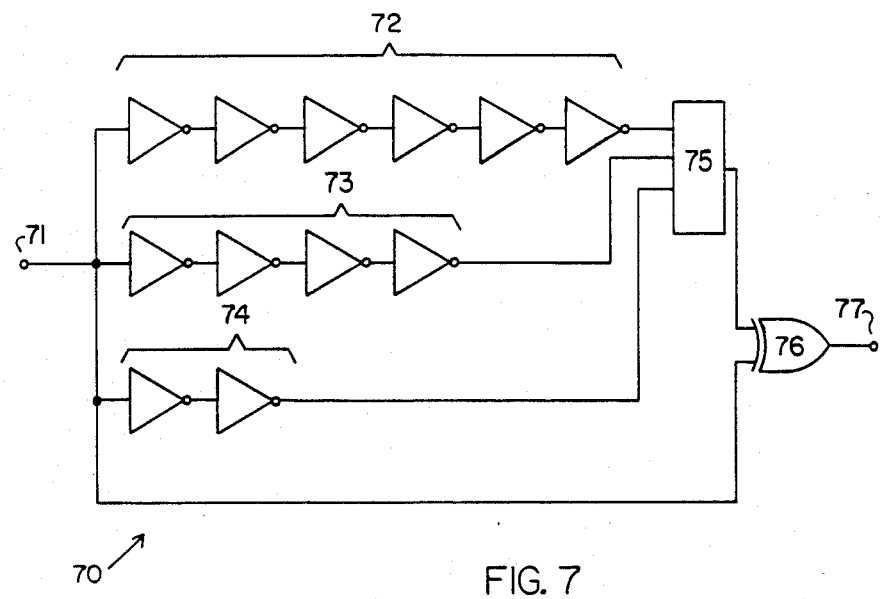
FIG. 7 is a schematic diagram of one embodiment of a pulse generator constructed in accordance with the teachings of this invention.

FIG. 1 is a schematic diagram of one embodiment of the present invention. Input terminal 23-1 of circuit 40 is connected to output lead 21 of digital circuitry 20 having a potentially variable propagation delay. Delay block 26 includes a plurality of delay lines, one of which is selected by multiplexer 36. A particular delay line of delay block 26 is selected by multiplexer 36 so that a substantially constant propagation delay is provided between input terminal 19 of digital circuitry 20 and output terminal 39, regardless of the amount of propagation delay provided by digital circuitry 20. Although delay block 26 can in practice contain any number of delay lines, delay block 26 of FIG. 1 is shown having three such delay lines 42, 44, and 45.

Ring oscillator 25 is a gated ring oscillator which provides to counter 37 an output signal having a frequency dependent upon the propagation delays of gates 33, 34, and 35 forming ring oscillator 25. Generally, circuit 20 and circuit 40 are constructed in the same piece of semiconductor material, and thus share the same power supply, the same process factors, and are at the same temperature, and thus the gate delays of gates 33, 34, and 35 are substantially equal and are equal to the propagation delays provided by the gates forming digital circuit 20 and the propagation delays provided by the gates of delay block 26. Counter 37 receives the output signal from ring oscillator 25. The frequency of the signal received by the counter 37 is the actual frequency of the signal of the oscillator 25, rather than a relative or comparison frequency as in the prior art. The counter 37 provides an output signal on port 41 which is stored in latch 50 and which in turn causes multiplexer 36 to select a particular delay line within delay block 26 having a propagation delay which corresponds to that delay necessary to provide a fixed propagation delay between input lead 19 of digital circuitry 20 and output terminal 39. In response to a precise clock signal (typically an externally provided crystal based clock signal), control means 43 provides control signals which control the gating of ring oscillator 25, the enabling and resetting of counter 37, and the operation of latch 50. Control means 43 is itself enabled by an external controller enable input. Circuit 40 has several phases during each cycle of its operation, as shown in Table I. During the first phase, the GATE ring oscillator signal goes high, thereby enabling ring oscillator 25 which begins to oscillate. Then, the ENABLE COUNTER singal goes high in order to enable counter 37, thereby causing counter 37 to count the pulses provided by ring oscillator 25. The GATE ring oscillator signal then goes low, thereby disabling ring oscillator 25, causing counter 37 to cease incrementing its count. The latch count signal then goes high in order to enable latch 50, thereby causing latch 50 to store the count provided by counter 37. Enable latch input terminal 13 is provided to allow coordination/synchronization between delay compensation circuit 40 and digital circuitry 20. This coordination with digital circuitry 20 is necessary so that multiplexer 36 does not switch from a first delay element to a second delay element while a signal is propagating through the first delay element, thereby losing that signal. The CLEAR COUNTER signal then goes high causing counter 37 to be reset to zero. At this time, if required, the cycle begins anew. Thus, periodically latch 50 is updated with a count provided by counter 37 which is representative of the frequency of oscillation of ring oscillator 25 which in turn is indicative of the propagation delays provided in the circuit, and thus the desired delay path of delay block 26. The count stored in latch 50 serves to control multiplexer 36 which selects the desired delay path in delay block 26.

One example of a typical ring oscillator which functions in a similar fashion as ring oscillator 25 in FIG. 1 is shown in FIG. 2. The signals provided on leads 55, 56, and 57 are shown in the voltage versus time waveforms of FIGS. 3a, 3b and 3c, respectively. When the signal on lead 55 changes from a logical 0 to a logical 1, after a certain propagation delay Δ (FIG. 3a) characteristic of inverter 52, inverter 52 causes the signal on lead 56 to change from a logical 1 to a logical 0. Similarly, after a propagation delay time Δ (FIG. 3b) characteristic of inverter 53, inverter 53 causes the signal on line 57 to change from a logical 0 to a logical 1. Consequently, the input signal on inverter 51 causes the output signal of inverter 51 to become a logical 0. In this manner, the signals in ring oscillator 50 continue to alternate between logical 1 and logical 0. Naturally, a greater number of inverters can be used in the ring oscillator, as long as the number of inverters is odd.

FIGS. 4a and 4b are voltage versus time diagrams of the signals on leads 24 and 22 of FIG. 1, respectively. When the gating signal on lead 24 is a logical 0, the output signal of NAND gate 33 is a logical 1. When the signal on lead 24 is a logical 1, NAND gate 33 functions as an inverter thereby causing ring oscillator 25 to oscillate. Thus, ring oscillator 25 provides the signal shown in FIG. 4. The pulses provided on output lead 22 of ring oscillator 25 while the signal on lead 24 is a logical 1 are counted by counter 37.

Counter 37 (FIG. 1) is shown as a bit counter for exemplary purposes only; counter 37 may have any number of bits depending upon the desired accuracy of measurement of the propagation delays in ring oscillator 25. If greater accuracy is necessary, either the frequency of the signal on lead 24 is reduced or the frequency of oscillation of ring oscillator 25 is increased, thereby allowing more cycles of ring oscillator 25 to be counted. Therefore, the time delays provided by the gates of ring oscillator 25, and thus the gates of circuit 20, is more accurately measured and counter 37 is designed with more than three bits.

An alternative embodiment of delay block 26 of FIG. 1 is shown in FIG. 5. In FIG. 5, delay block 26 is formed using a plurality of inverters placed in series, as shown. A plurality of taps are provided, each tap providing a version of the input signal provided on input lead 23-1 having a unique propagation delay. Thus, the signal provided on lead 26-1 will have no propagation delay, the signal provided on lead 26-2 will have a propagation delay equal to the propagation delay of 2 inverters, and the like. Multiplexer 36, under the control of the count stored in latch 50 (FIG. 1) selects an appropriate tap 26-1 through 26-4 in order to provide an output signal on output lead 36-1 having a desired propagation delay.

In regard to FIG. 5, it will again be seen that, with appropriate reference to FIG. 1, the actual output frequency of the oscillator, rather than any comparative or relative frequencies, is measured by a means for such measuring, which produces an output signal in turn used to select the appropriate tap 26-1 through 26-4 in order to provide an output signal on output lead 36-1 having a desired propagation delay.

FIG. 6 shows a schematic diagram of one embodiment of controller 43 of FIG. 1. In this embodiment, controller 43 includes four bit counter 61 which counts the externally supplied CLOCK signal CLK applied to input terminal 60. CLOCK signal 60 is a highly stable CLOCK, and is typically generated from a crystal controlled oscillator. First the controller is enabled via the external enable controller signal. As shown in Table II, when counter 61 reaches a count of 0010, gate 62-1 provides a logical 1 ENABLE COUNTER signal which enables the counter to count. When counter 61 reaches a count of 0100, gate 62-2 provides a logical 1 START RING OSCILLATOR signal which is applied to the S input terminal of RS flip flop 64, thus causing flip flop 64 to provide logical 1 GATE RING OSCILLATOR output signal on lead 24. This causes the ring oscillator to oscillate. When counter 61 reaches a count of 1100, gate 62-3 provides a logical 1 STOP RING OSCILLATOR signal which is applied to the R input lead of flip flop 64, thus causing the GATE RING OSCILLATOR signal on lead 24 to go low. When counter 61 reaches a count of 1110, gate 62-4 provides a logical 1 LATCH COUNT signal to store results of counter 37. When counter 61 reaches a count of 0000, gate 62-5 provides logical 1 CLEAR COUNTER signal. At this point the controller can be disabled externally via the enable controller signal. In this manner, a very simple four bit counter 61 and a handful of gates are utilized to construct controller 43 of FIG. 1. Other embodiments of this invention may have other instructional correlations between counter values and instructions to counter 37.

In one embodiment of this invention, the longest delay line of delay block 26 is chosen so that the delay introduced by the longest delay line is approximately equal to the difference between the longest propagation delay that may be introduced by digital circuit 20 and the shortest delay that may be introduced by digital circuit 20. Circuit 40 selects an appropriate delay line such that the output signal on output terminal 39 has a propagation delay between the input lead 19 of digital circuitry 20 to the output terminal 39 approximately equal to the longest potential delay introduced by digital circuit 20. Therefore, in accordance with the teachings of this invention, a circuit (such as digital circuit 20) is constructed which includes means for adding an additional propagation delay in order to insure that the total propagation delay is constant regardless of process variations in the integrated circuitry, temperature variations, power supply voltage, or any other factor which may affect the propagation delays of the circuit. Of importance, when inverters are used in delay block 26, each delay element must have an even number of inverters in order to provide the equivalent, not the inverse, of the signal provided by the circuit (not shown) connected to input terminal 21. This circuit is extremely useful in integrated circuitry where all components of an integrated circuit are subjected to the same process and temperature variations. Other delay elements, such as AND gates with input leads tied together may be used in place of inverters in delay block 26.

The delay element need not be provided by a delay block similar to delay block 26. One method of selecting the delay indicated by counter 37 is to include a variable delay element with each gate. This can be accomplished by including several delay elements and a multiplexer in each logic gate of the circuit. Another method is selecting the amount of current supplied to the base of merged transistor logic (MTL, also known as integrated injection logic, 12L) gates thereby varying the propagation delay introduced by these gates (see Holt, *Electronic Circuits: Digital and Analog*, FIGS. 7-15 (1978), which is hereby incorporated by reference).

FIG. 7 depicts one embodiment of a pulse generator constructed in accordance with the teachings of this invention. Pulse generator 70 of FIG. 7 includes input terminal 71 for receiving an input signal defining when a pulse having a desired duration is to be provided on output terminal 77. A plurality of propagation delay paths 72, 73, and 74 are shown, although naturally any number of desired propagation delay paths can be used. Each delay line 72, 73, and 74 provides a unique propagation delay of the input signal applied to input terminal 71. The output leads of propagation delay means 72, 73, and 74 are applied to input leads of multiplexer 75 which, in response to control signals applied to control leads (not shown) selects a desired one of delay lines 72, 73, and 74. The signal selected by multiplexer 75 from the desired delay means is applied to one input lead of exclusive OR GATE 76. The other input lead of exclusive OR GATE 76 receives as its input signal the input signal applied to terminal 71. In this manner, exclusive OR GATE 76 provides an output pulse on output terminal 77 in response to each input signal applied to input terminal 71. In one embodiment of this invention, multiplexer 75 is controlled by a count value, such as the count value stored in latch 50 of FIG. 1, thereby to ensure that the pulse width of the output pulse generated on output terminal 77 is substantially constant over wide variations in processing, temperature, power supply voltages, and the like. In another embodiment of this invention, multiplexer 75 is controlled by control signals which allow the output pulse provided on output terminal 77 to have any one of a plurality of pulse widths, as desired.

While this specification illustrates specific embodiments of this invention, it is not to be interpreted as limiting the scope of the invention. Many embodiments of this invention will become evident to those of ordinary skill in the art in light of the teachings of this specification.

TABLE 1

Start Cycle (enable controller)
Enable Counter
Start Ring Oscillator
Stop Ring Oscillator
Latch Count
Clear Counter
End Cycle (disable controller)

TABLE II

|  | $O_4$ | $O_3$ | $O_2$ | $O_1$ |
|---|---|---|---|---|
| Enable Counter | 0 | 0 | 1 | 0 |
| Start Ring Oscillator | 0 | 1 | 0 | 0 |
| Stop Ring Oscillator | 1 | 1 | 0 | 0 |
| Latch Count | 1 | 1 | 1 | 0 |
| Clear Counter | 0 | 0 | 0 | 0 |

I claim:

1. A propagation delay control circuit for controlling propagation delays in a semiconductor element comprising:
    propagation delay means having an adjustable propagation delay;
    means, independent of said propagation delay means, for continuously detecting the propagation delay in said semiconductor element comprising means for detecting said propagation delay through one or more gates forming an oscillator contained within said semiconductor element and means for measuring the actual frequency of said oscillator, said means for measuring producing an output signal; and
    means for adjusting said propagation delay of said propagation delay means in response to said output signal of said means for measuring the actual frequency of said oscillator,
    wherein said oscillator produces a frequency which is solely dependent upon said propagation delay through said gates.

2. The circuit as in claim 1 wherein said oscillator comprises:
    a first inverter having an input lead, and having an output lead serving as said output lead of said oscillator;
    a second inverter having an input lead connected to said output lead of said first inverter, and having an output lead; and
    a third inverter having an input lead connected to said output lead of said second inverter, and an output lead connected to said input lead of said first inverter.

* * * * *